（12）United States Patent
Ning et al.

(10) Patent No.: US 11,886,357 B2
(45) Date of Patent: Jan. 30, 2024

(54) MEMORY FOR REDUCING COST AND POWER CONSUMPTION

(71) Applicant: CHANGXIN MEMORY TECHNOLOGIES, INC., Hefei (CN)

(72) Inventors: Shu-Liang Ning, Hefei (CN); Jun He, Hefei (CN); Zhan Ying, Hefei (CN); Jie Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 74 days.

(21) Appl. No.: 17/445,658

(22) Filed: Aug. 23, 2021

(65) Prior Publication Data

US 2022/0066962 A1    Mar. 3, 2022

Related U.S. Application Data

(63) Continuation of application No. PCT/CN2021/099868, filed on Jun. 11, 2021.

(30) Foreign Application Priority Data

Aug. 26, 2020  (CN) ......................... 202010873263.9

(51) Int. Cl.
*G06F 13/16*  (2006.01)
*G06F 12/02*  (2006.01)
(Continued)

(52) U.S. Cl.
CPC ............ *G06F 13/1668* (2013.01); *G06F 1/08* (2013.01); *G06F 12/0223* (2013.01); *G06F 1/12* (2013.01);
(Continued)

(58) Field of Classification Search
CPC .... G06F 13/1668; G06F 1/08; G06F 12/0223; G06F 1/12; G06F 2212/1024; G11C 11/401; H01L 25/0657; H01L 2225/06541
See application file for complete search history.

(56) References Cited

U.S. PATENT DOCUMENTS 5,353,243 A     10/1994  Read
7,133,324 B2 *  11/2006  Park ..................... G11C 7/1066
                                                    365/233.13
(Continued)

FOREIGN PATENT DOCUMENTS

CN        1502108 A       6/2004
CN        1527322 A       9/2004
(Continued)

OTHER PUBLICATIONS

International Search Report in the international application No. PCT/CN2021/104776, dated Oct. 13, 2021.
(Continued)

*Primary Examiner* — Idriss N Alrobaye
*Assistant Examiner* — Richard B Franklin
(74) *Attorney, Agent, or Firm* — Syncoda LLC; Feng Ma (57) ABSTRACT

A memory includes: a control chip; and a plurality of storage chips, in which the plurality of storage chips are electrically connected with the control chip via a common communication channel, the plurality of storage chips include a first storage chip set and a second storage chip set, the storage chips in the first storage chip set are configured to perform information interaction with the control chip by adopting a first clock signal, the storage chips in the second storage chip set are configured to perform information interaction with the control chip by adopting a second clock signal, and phase of the first clock signal is different from phase of the second clock signal.

19 Claims, 4 Drawing Sheets

(51) Int. Cl.
*G06F 1/08* (2006.01)
*G06F 1/12* (2006.01)
*G11C 11/401* (2006.01)
*H01L 25/065* (2023.01)

(52) U.S. Cl.
CPC .... *G06F 2212/1024* (2013.01); *G11C 11/401* (2013.01); *H01L 25/0657* (2013.01); *H01L 2225/06541* (2013.01)

(56) References Cited

U.S. PATENT DOCUMENTS

| | | | |
|---|---|---|---|
| 8,194,090 | B2 | 6/2012 | Sato |
| 8,447,908 | B2 | 5/2013 | Bruce |
| 8,635,390 | B2 | 1/2014 | Hnatko |
| 8,947,931 | B1 | 2/2015 | D'Abreu |
| 9,170,744 | B1 | 10/2015 | Smith |
| 9,396,766 | B2 | 7/2016 | Lym |
| 9,805,802 | B2 | 10/2017 | Son et al. |
| 10,283,178 | B2 * | 5/2019 | Takahashi ............... G11C 8/12 |
| 10,446,198 | B2 | 10/2019 | Hasbun et al. |
| 10,725,913 | B2 | 7/2020 | Hasbun et al. |
| 10,762,012 | B2 * | 9/2020 | Lee ................ G06F 13/1657 |
| 10,915,473 | B2 | 2/2021 | Jang |
| 10,978,116 | B2 | 4/2021 | Hasbun et al. |
| 2002/0018393 | A1 | 2/2002 | Kyung |
| 2002/0060948 | A1 | 5/2002 | Chang |
| 2002/0174311 | A1 | 11/2002 | Ware |
| 2003/0086329 | A1 | 5/2003 | Ebihara |
| 2004/0054845 | A1 | 3/2004 | Ware |
| 2004/0105292 | A1 | 6/2004 | Matsui |
| 2004/0170072 | A1 | 9/2004 | Ware |
| 2005/0169097 | A1 | 8/2005 | Ware |
| 2006/0007761 | A1 | 1/2006 | Ware |
| 2006/0039174 | A1 | 2/2006 | Ware |
| 2006/0069895 | A1 | 3/2006 | Ware |
| 2006/0090149 | A1 | 4/2006 | Blanco |
| 2006/0129776 | A1 | 6/2006 | Ware |
| 2006/0233012 | A1 | 10/2006 | Sekiguchi |
| 2007/0064462 | A1 | 3/2007 | Matsui |
| 2007/0255919 | A1 | 11/2007 | Ware |
| 2009/0063887 | A1 | 3/2009 | Ware |
| 2009/0122587 | A1 | 5/2009 | Matsui |
| 2009/0138646 | A1 | 5/2009 | Ware |
| 2009/0150710 | A1 | 6/2009 | Bilger |
| 2009/0184971 | A1 | 7/2009 | Sato |
| 2010/0091537 | A1 | 4/2010 | Best |
| 2011/0161568 | A1 | 6/2011 | Bruce |
| 2011/0164460 | A1 | 7/2011 | Kajigaya |
| 2012/0059958 | A1 | 3/2012 | Hnatko |
| 2012/0059977 | A1 | 3/2012 | Chuang |
| 2012/0092944 | A1 | 4/2012 | Lin |
| 2012/0182776 | A1 | 7/2012 | Best |
| 2012/0213020 | A1 | 8/2012 | Ware |
| 2012/0287725 | A1 | 11/2012 | Ware |
| 2012/0294058 | A1 | 11/2012 | Best |
| 2013/0148448 | A1 | 6/2013 | Matsui |
| 2013/0227229 | A1 | 8/2013 | Ishikawa |
| 2013/0250706 | A1 | 9/2013 | Ware et al. |
| 2013/0279278 | A1 | 10/2013 | Ware et al. |
| 2013/0305079 | A1 | 11/2013 | Ware et al. |
| 2014/0098622 | A1 | 4/2014 | Ware et al. |
| 2014/0169111 | A1 | 6/2014 | Kajigaya et al. |
| 2014/0247637 | A1 | 9/2014 | Best |
| 2014/0293705 | A1 | 10/2014 | Gillingham |
| 2015/0043290 | A1 | 2/2015 | Ware et al. |
| 2015/0187410 | A1 * | 7/2015 | Nelson ................. G11C 29/48 365/189.02 |
| 2015/0332753 | A1 | 11/2015 | Best et al. |
| 2016/0065190 | A1 | 3/2016 | Paul |
| 2016/0093378 | A1 | 3/2016 | Lym |
| 2016/0196864 | A1 | 7/2016 | Ware et al. |
| 2016/0225431 | A1 | 8/2016 | Best et al. |
| 2017/0053691 | A1 | 2/2017 | Ware et al. |
| 2017/0069364 | A1 | 3/2017 | Shin et al. |
| 2017/0076768 | A1 | 3/2017 | Son et al. |
| 2017/0194945 | A1 | 7/2017 | Paul |
| 2017/0365309 | A1 | 12/2017 | Shin et al. |
| 2018/0005689 | A1 | 1/2018 | Hsieh |
| 2018/0012644 | A1 | 1/2018 | Ware et al. |
| 2018/0033489 | A1 | 2/2018 | Son et al. |
| 2018/0122434 | A1 | 5/2018 | Lee |
| 2018/0166121 | A1 | 6/2018 | Best et al. |
| 2018/0218762 | A1 | 8/2018 | Matsui |
| 2018/0293190 | A1 | 10/2018 | Jang |
| 2019/0065050 | A1 | 2/2019 | Shin et al. |
| 2019/0102298 | A1 | 4/2019 | Hasbun et al. |
| 2019/0102330 | A1 | 4/2019 | Hasbun et al. |
| 2019/0103143 | A1 | 4/2019 | Hasbun et al. |
| 2019/0146911 | A1 | 5/2019 | Ha et al. |
| 2019/0198084 | A1 | 6/2019 | Penney |
| 2019/0205051 | A1 | 7/2019 | Choi et al. |
| 2019/0221249 | A1 | 7/2019 | Best et al. |
| 2019/0311762 | A1 | 10/2019 | Penney |
| 2019/0325936 | A1 | 10/2019 | Ware et al. |
| 2019/0348085 | A1 | 11/2019 | Matsui |
| 2020/0020367 | A1 | 1/2020 | Hasbun et al. |
| 2020/0075069 | A1 | 3/2020 | Kim |
| 2020/0125257 | A1 | 4/2020 | Shin et al. |
| 2020/0125506 | A1 | 4/2020 | Crisp |
| 2020/0176038 | A1 | 6/2020 | Kim |
| 2020/0202910 | A1 | 6/2020 | Park et al. |
| 2020/0278790 | A1 | 9/2020 | Shin et al. |
| 2020/0321047 | A1 | 10/2020 | Best et al. |
| 2020/0327057 | A1 | 10/2020 | Hasbun et al. |
| 2021/0005234 | A1 * | 1/2021 | Galbi .................. G06F 13/287 |
| 2021/0027825 | A1 | 1/2021 | Ware et al. |
| 2021/0193215 | A1 | 6/2021 | Best et al. |
| 2021/0272608 | A1 | 9/2021 | Matsui |
| 2021/0358529 | A1 | 11/2021 | Shin et al. |
| 2022/0139446 | A1 | 5/2022 | Best et al. |
| 2022/0351764 | A1 | 11/2022 | Shin et al. |
| 2023/0018344 | A1 | 1/2023 | Matsui |

FOREIGN PATENT DOCUMENTS

| | | |
|---|---|---|
| CN | 101488337 A | 7/2009 |
| CN | 102402493 A | 4/2012 |
| CN | 102456392 A | 5/2012 |
| CN | 102541782 A | 7/2012 |
| CN | 103150272 A | 6/2013 |
| CN | 106463499 A | 2/2017 |
| CN | 106796813 A | 5/2017 |
| CN | 206400408 U | 8/2017 |
| CN | 109599138 A | 4/2019 |
| CN | 109599139 A | 4/2019 |
| CN | 109599141 A | 4/2019 |
| CN | 109783009 A | 5/2019 |
| CN | 109994138 A | 7/2019 |
| CN | 110880341 A | 3/2020 |
| CN | 111540391 A | 8/2020 |
| CN | 211207252 U | 8/2020 |
| CN | 114115441 A | 3/2022 |

OTHER PUBLICATIONS

International Search Report in the international application No. PCT/CN2021/098752, dated Sep. 8, 2021.
International Search Report in the international application No. PCT/CN2021/099868, dated Sep. 15, 2021.
International Search Report in the international application No. PCT/CN2021/103706, dated Sep. 28, 2021.
International Search Report in the international application No. PCT/CN2021/125785, dated Jan. 25, 2022.
Supplementary European Search Report in the European application No. 21860596.2, dated Nov. 23, 2022.
Supplementary Partial European Search Report in the European application No. 21859788.8, dated Dec. 1, 2022.
Supplementary European Search Report in the European application No. 21859788.8, dated Mar. 16, 2023.
First Office Action of the Chinese application No. 202010873263.9, dated Jul. 22, 2023, 7 pages with English abstract.

(56) References Cited

OTHER PUBLICATIONS

Notice of Allowance of the Chinese application No. 202010873269.6, dated Jun. 29, 2023, 5 pages with English abstract.

* cited by examiner

MEMORY FOR REDUCING COST AND POWER CONSUMPTION

CROSS-REFERENCE TO RELATED APPLICATIONS

This is a continuation of international Patent Application No. PCT/CN2021/099868 filed on Jun. 11, 2021, which claims priority to Chinese Patent Application No. 202010873263.9 filed on Aug. 26, 2020. The disclosures of these applications are hereby incorporated by reference in their entirety.

BACKGROUND

A Dynamic Random Access Memory (DRAM) is a common semiconductor storage device in a computer and is composed of many repeated storage units. Each storage unit usually includes a capacitor and a transistor. Gates of the transistors are connected with a word line, drains of the transistors are connected with a bit line, and sources of the transistors are connected with the capacitors. Voltage signals on the word line can control on or off of the transistors, so that data information stored in the capacitors is read through the bit line, or the data information is written into the capacitors for storage through the bit line.

With more and more application fields of the DRAM, for example, the DRAM is increasingly applied to various fields, a user has higher and higher requirements for a performance index of the DRAM, and has different requirements for the DRAM due to the different application fields.

SUMMARY

Embodiments of the present disclosure relate to the technical field of semiconductors, and in particular to a memory.

An embodiment of the present disclosure provides a memory, including: a control chip; and a plurality of storage chips, in which the plurality of storage chips are electrically connected with the control chip via a common communication channel, the plurality of storage chips include a first storage chip set and a second storage chip set, the storage chips in the first storage chip set are configured to perform information interaction with the control chip by adopting a first clock signal, the storage chips in the second storage chip set are configured to perform information interaction with the control chip by adopting a second clock signal, and phase of the first clock signal is different from phase of the second clock signal.

BRIEF DESCRIPTION OF THE DRAWINGS

One or more embodiments are exemplarily illustrated through diagrams in the drawings corresponding thereto, but the exemplary illustration does not limit the embodiments; and elements with like reference numerals in the drawings represent similar elements, and unless otherwise specifically specified, the graphs in the drawings do not limit the proportion.

DETAILED DESCRIPTION

It can be known from the background that performance of a memory in the related art needs to be improved.

In order to solve the above problem, an embodiment of the present disclosure provides a memory, including a plurality of storage chips. The plurality of storage chips share a communication channel to be electrically connected with a control chip. The plurality of storage chips include a first storage chip set and a second storage chip set, the storage chips of the first storage chip set are configured to perform information interaction with the control chip by adopting a first clock signal, the storage chips in the second storage chip set are configured to perform information interaction with the control chip by adopting a second clock signal, and phase of the first clock signal is different from phase of the second clock signal. Since the plurality of storage chips share the communication channel, under the premise of not influencing the quality of information interaction between the plurality of storage chips and the control chip, the number of the communication channel required by the memory is decreased, thereby saving the area of the memory, reducing the cost of the memory, and reducing power consumption of the memory.

In order to make the objective, technical solutions and advantages of the embodiments of the present disclosure more clear, all the embodiments of the present disclosure will be described below in detail with reference to the drawings. However, the ordinary skilled in the art may understand that a lot of technical details are proposed to make the present disclosure better understood by a reader in the embodiments of the present disclosure. However, the technical solution claimed in the present disclosure can also be implemented without these technical details and various changes and modifications based on the following embodiments.

Figure 1:
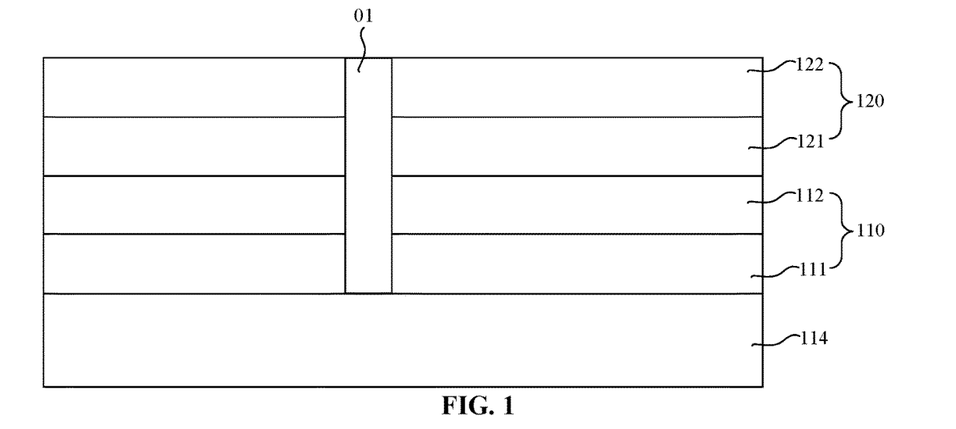
FIG. 1 is a schematic structural diagram of a memory provided by an embodiment of the present disclosure.

FIG. 1 is a schematic structural diagram of a memory provided by an embodiment of the present disclosure.

Referring to FIG. 1, in the embodiment, the memory includes: a control chip 114; and a plurality of storage chips, in which the plurality of storage chips share a communication channel 01 to be electrically connected with the control chip 114. The plurality of storage chips include a first storage chip set 110 and a second storage chip set 120. The storage chips in the first storage chip set 110 are configured to perform information interaction with the control chip by adopting a first clock signal 114, the storage chips in the second storage chip set 120 are configured to perform information interaction with the control chip by adopting a second clock signal 114, and phase of the first clock signal is different from phase of the second clock signal.

The memory provided by the embodiment will be illustrated below in detail with reference to the drawings.

In the embodiment, the memory may be a dynamic random access memory.

Specifically, the plurality of storage chips may be sequentially stacked on the control chip 114, thereby improving a storage density and decreasing a distance between the storage chips and the control chip 114 advantageously. Or, the plurality of storage chips may also be disposed on the control chip 114 side by side, thereby reducing a longitudinal thickness of the memory advantageously. In the embodiment, the plurality of storage chips are sequentially stacked on the control chip 114, and the communication channel 01 includes a Through Silicon Via (TSV).

Phase of the first clock signal is different from phase of the second clock signal, therefore, a moment of a clock edge of the first clock signal and a clock edge of the second clock signal can be distinguished, and the clock edge includes a rising edge and a falling edge. In this way, although the first storage chip set 110 and the second storage chip set 120 share the communication channel 01, the storage chips in the first storage chip set 110 and the second storage chip set 120 can be in information interaction with the control chip 114 at different moments.

In the embodiment, as illustrated in FIG. 1, the first storage chip set 110 includes a first storage chip 111 and a second storage chip 112. The first storage chip performs information interaction with the control chip 114 at a rising edge of the first clock signal, and the second storage chip 112 performs information interaction with the control chip 114 at a falling edge of the first clock signal. The second storage chip set 120 includes a third storage chip 121 and a fourth storage chip 122. The third storage chip 121 performs information interaction with the control chip 114 at a rising edge of the second clock signal, and the fourth storage chip 122 performs information interaction with the control chip 114 at a falling edge of the second clock signal.

It is to be noted that the first storage chip 111 and the second storage chip 112 may be located in adjacent layers, or may also be spaced by other storage chips. The third storage chip 121 and the fourth storage chip 122 may be located in adjacent layers, or may also be spaced by other storage chips.

Since the first storage chip 111 and the second storage chip 112 work at different clock states of the same first clock signal, an overall macroscopic operation mode of the first storage chip 111 and the second storage chip 112 is: data are transmitted at both the rising edge and the falling edge of the first clock signal. Therefore, the data are transmitted at one of the rising edge or the falling edge of the first clock signal as for the single storage chip, but the data may be transmitted at both the rising edge and the falling edge of the first clock signal as for the overall memory. Similarly, the third storage chip 121 and the fourth storage chip 122 also work at different clock states of the same second clock signal, and also have the effect that the data are transmitted at both the rising edge and the falling edge of the second clock signal as for the overall memory.

Furthermore, the first clock signal includes a first command clock and a first data clock, and the second clock signal includes a second command clock and a second data clock. As for the first storage chip set 110, the first storage chip 111 performs information interaction with the control chip 114 at a rising edge of the first command clock and/or the first data clock; and the second storage chip 112 performs information interaction with the control chip 114 at a falling edge of the first command clock and/or the first data clock. As for the second storage chip set 120, the third storage chip 121 performs information interaction with the control chip 114 at a rising edge of the second command clock and/or the second data clock; and the fourth storage chip 122 performs information interaction with the control chip 114 at a falling edge of the second command clock and/or the second data clock.

Taking the first storage chip 111 as an example, the first storage chip 111 is configured to receive a command signal at the rising edge of the first command clock. The command signal is configured to control read-write operation of the first storage chip 111, and receive a data signal to be written into the first storage chip 111 or send the data signal at the rising edge of the corresponding data clock. Relevant description related to the second storage chip 112, the third storage chip 121 and the fourth storage chip 122 may refer to the first storage chip 111.

In the embodiment, in order to reduce complexity of the memory, the first command clock and the first data clock adopt the same first clock signal, and the second command clock and the second data clock adopt the same second clock signal. In this way, circuit design is simplified advantageously, a data receiving or sending error caused by an error generated by handshake or synchronization of the first command clock and the first data clock is avoided, a data receiving or sending error caused by an error generated by handshake or synchronization of the second command clock and the second data clock is avoided, and a storage accurate rate of the memory is increased.

It is to be noted that in other embodiments, the first command clock and the first data clock may also adopt different first clock signals, and the second command clock and the second data clock may also adopt different second clock signals.

Furthermore, in the embodiment, frequency of the first clock signal is the same as frequency of the second clock signal. In this way, the rising edge of the first clock signal and the rising edge of the second clock signal, or, the falling edge of the first clock signal and the falling edge of the second clock signal may be effectively prevented from occurring at the same moment during an operation period of the memory. It is ensured that the first clock signal and the second clock signal may be accurately recognized by the corresponding storage chip, thereby improving read-write accuracy of the memory. It may be understood that in other embodiments, an absolute value of a difference value between the frequency of the first clock signal and the frequency of the second clock signal is within an allowable value, thus it may also be considered that frequency of the first clock signal is the same as frequency of the second clock signal. It is to be noted that the frequency of the first clock signal and the frequency of the second clock signal may also be in a multiple relationship, as long as the above requirement for distinguishing the clock edge is met.

Accordingly, a difference between the phase of the first clock signal and the phase of the second clock signal is odd times of 90 degrees, for example, the phase difference is 3 times, 5 times or 7 times of 90 degrees. In this way, the rising edge of the first clock signal and the rising edge of the second clock signal, or, the falling edge of the first clock signal and the falling edge of the second clock signal are further advantageously prevented from occurring at the same moment during the operation period of the memory, thereby further improving the read-write accuracy of the memory.

Compared with the related art, the technical solution provided by the embodiment of the present disclosure has the following advantages:

The embodiment of the present disclosure provides the memory with excellent structural performance. The plurality of storage chips share the communication channel to be electrically connected with the control chip. The plurality of storage chips include the first storage chip set and the second storage chip set, the storage chips in the first storage chip set are configured to adopt the first clock signal to be in information interaction with the control chip, the storage chips in the second storage chip set are configured to adopt the second clock signal to be in information interaction with the control chip, and phase of the first clock signal is different from phase of the second clock signal. The plurality of storage chips share the communication channel to be electrically connected with the control chip, therefore, there is no need to dispose a communication channel electrically connected with the control chip for each storage chip, thereby decreasing the number of the communication channels required by the memory advantageously, and reducing the cost and the power consumption of the memory accordingly.

Furthermore, the row address port and the column address port are separated, therefore the row address signal and the column address signal may be transmitted simultaneously, avoiding the problem that an activation command signal can only be transmitted after the read command is transmitted. Thus, the problem that a data cable is not occupied completely at certain time periods is avoided advantageously, and it is ensured that the data cable is occupied completely by data all the time, thereby increasing the storage speed of the memory, and improving the storage performance of the memory.

Figure 2:
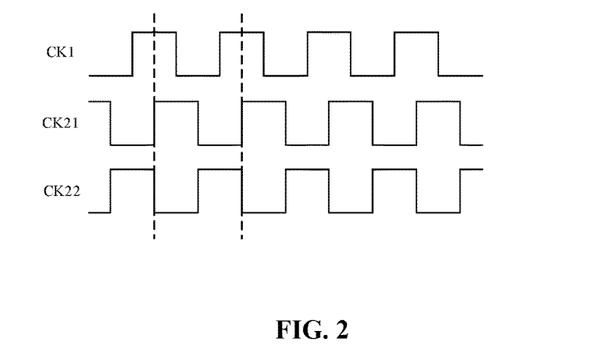
FIG. 2 illustrates two different oscillograms of a first clock signal and second clock signal.

Specifically, FIG. 2 is two different oscillograms of the first clock signal and the second clock signal. CK1 shows the first clock signal, CK21 shows the second clock signal, and the phase difference of the first clock signal and the second clock signal is 90 degrees. CK22 shows another second clock signal, and the phase difference of the first clock signal and the second clock signal is 270 degrees.

Figure 3:
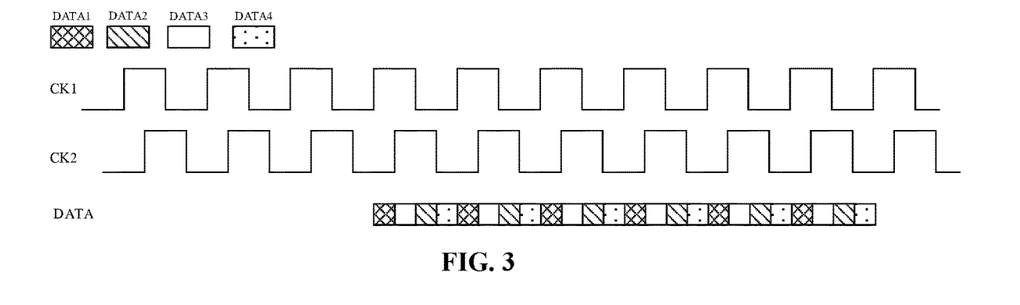
FIG. 3 is a timing diagram of an operation signal corresponding to each storage chip in a memory provided by an embodiment of the present disclosure.

FIG. 3 is a timing diagram of a operation signal corresponding to each storage chip in the memory provided by the embodiment. CK1 is the first clock signal, CK2 is the second clock signal, DATA1 is a timing diagram of data transmission by the first storage chip 111, DATA2 is a timing diagram of data transmission by the second storage chip 112, DATA3 is a timing diagram of data transmission by the third storage chip 121, DATA4 is a timing diagram of data transmission by the fourth storage chip 122, and DATA is a timing diagram combining DATA1, DATA2, DATA3 and DATA4.

A operating principle of the memory provided by the embodiment will be illustrated below with reference to FIG. 3.

At the first rising edge of the first clock signal, the first storage chip 111 receives an activation command signal; at the $m^{th}$ rising edge of the clock signal, the first storage chip 111 receives a read command signal; and at the $n^{th}$ rising edge of the first clock signal, the first storage chip 111 transmits data. At the first falling edge of the first clock signal, the second storage chip 112 receives an activation command signal; at the $m^{th}$ falling edge of the first clock signal, the second storage chip 112 receives a read command signal; and at the $n^{th}$ falling edge of the first clock signal, the second storage chip 112 transmits data. In this way, the first storage chip 111 transmits the data at the different rising edges of the first clock signal, and the second storage chip 112 transmits the data at the different falling edges of the first clock signal, until data transmission is completed.

At the first rising edge of the second clock signal, the third storage chip 121 receives an activation command signal; at the $m^{th}$ rising edge of the clock signal, the third storage chip 121 receives a read command signal; and at the $n^{th}$ rising edge of the second clock signal, the third storage chip 121 transmits data. At the first falling edge of the second clock signal, the fourth storage chip 122 receives an activation command signal; at the $m^{th}$ falling edge of the second clock signal, the fourth storage chip 122 receives a read command signal; and at the $n^{th}$ falling edge of the second clock signal, the fourth storage chip 122 transmits data. In this way, the third storage chip 121 transmits the data at the different rising edges of the second clock signal, and the fourth storage chip 122 transmits the data at the different falling edges of the second clock signal, until data transmission is completed.

It can be understood that the above illustration takes an example that the memory performs read operation. During a write operation period of the memory, the first storage chip 111 and the second storage chip 112 also transmit data alternately, and the third storage chip 121 and the fourth storage chip 122 also transmit data alternately.

In the embodiment, the first storage chip set 110 includes the two storage chips, and the second storage chip set 120 includes the two storage chips. It is to be noted that in other embodiments, the first storage chip set may be a single storage chip, and the storage chip may be in information interaction with the control chip at the rising edge or the falling edge of the first clock signal; and the second storage chip set may be a single storage chip, and the storage chip may be in information interaction with the control chip at the rising edge or the falling edge of the second clock signal.

According to the memory provided by the embodiment, the plurality of storage chips share the communication channel 01, therefore, under the premise of not influencing a band width of the information interaction of the control chip 114 and the plurality of storage chips, the number of the communication channel 01 of the memory is decreased, and therefore the manufacturing cost and power consumption of the memory are reduced.

Another embodiment of the present disclosure further provides a memory. The memory is roughly the same as the above-mentioned embodiment, and the main difference includes more detailed illustration on each storage chip. The memory provided by the embodiment will be illustrated below in detail with reference to the drawings. It is to be noted that, the part the same as or corresponding to the above-mentioned embodiment may refer to the illustration of the above-mentioned embodiment, which will be not repeated hereinafter.

Figure 4:
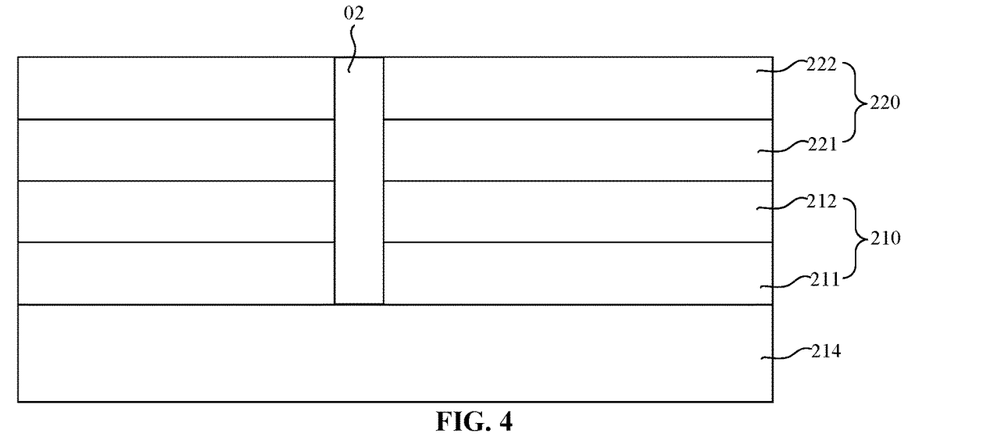
FIG. 4 is a schematic structural diagram of a memory provided by another embodiment of the present disclosure.
Figure 5:
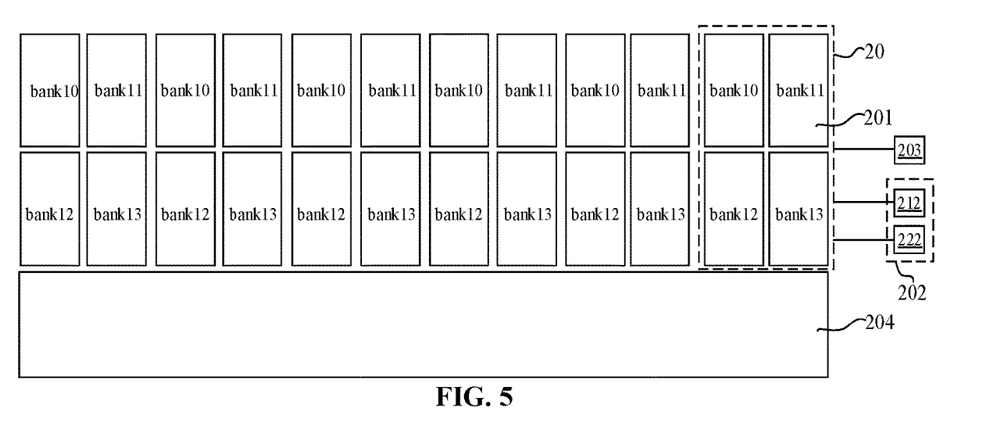
FIG. 5 is a schematic structural diagram of a storage chip in FIG. 4.

FIG. 4 is a schematic structural diagram of the memory provided by another embodiment of the present disclosure. FIG. 5 is a schematic structural diagram of one storage chip in FIG. 4.

Referring to FIG. 4 and FIG. 5, in the embodiment, the memory includes: a control chip 214; and a plurality of storage chips, in which the plurality of storage chips include a first storage chip set 210 and a second storage chip set 220, and the above-mentioned information interaction includes read-write operation. Each storage chip includes at least one channel 20. The channel 20 includes: a plurality of storage banks 201, in which each storage bank 201 includes a plurality of storage units, and the plurality of storage banks 201 are configured to perform the read-write operation alternately; a command port 202, in which the command port 202 is configured to receive a command signal at a corresponding clock edge, and the command signal is configured to control the read-write operation of the storage banks 201; and a data port 203, in which the data port 203 is configured to receive a data signal to be written into the storage banks 201 or send the data signal at the corresponding clock edge. The corresponding clock edge includes a clock edge of the first clock signal or a clock edge of the second clock signal. The command port 202 includes a row address port 212 and a column address port 222, the row address port 212 is configured to receive a row address signal of a position where a target storage unit is located, the column address port 222 is configured to receive a column address signal of the position where the target storage unit is located, and the target storage unit is a storage unit selected from the plurality of storage units.

It can be understood that the corresponding clock edge refers to a first rising edge or falling edge corresponding to the storage chip during information interaction, and a rising edge or a falling edge of a data clock corresponding to the storage chip during information interaction.

It is to be noted that the command port called in the embodiment includes a port for transmitting the command signal and the address signal, but is not limited to this.

The memory provided by the embodiment will be illustrated below in detail with reference to the drawings.

The plurality of storage units in each storage bank 201 may be distributed in an array. In the embodiment, taking an example that each channel 20 includes four storage banks 201, the four storage banks 201 in one channel 20 are illustrated as bank10, bank11, bank12 and bank13 in FIG. 5. It may be understood that in other embodiments, the number of the storage banks included in each channel may also be any other number, such as two and six.

The data port 203 is configured to receive data to be stored into the storage units or send the data read from the storage units.

The storage chips include the plurality of channels 20, and the storage chips further include a common circuit 204 shared by the plurality of channels 20. In the embodiment, the common circuit 204 may be a test control circuit, and the test control circuit is configured to control testing of the plurality of channels 20. In other embodiments, the common circuit may also be at least one of a temperature sensor circuit, an analogy circuit or a charge pump circuit.

The memory may further include: a test port. Under a test mode, the plurality of channels 20 share the same test port for testing. Since the common test port is disposed, the number of ports in the memory is decreased advantageously, thereby reducing the difficulty of testing the memory through a probe card, and reducing the manufacturing difficulty of the probe card.

As for the storage chips in the first storage chip set 210, the corresponding clock edge is the clock edge of the first clock signal; and as for the storage chips in the second storage chip set 220, the corresponding clock edge is the clock edge of the second clock signal.

The command signal includes activation commands and read commands corresponding to respective activation commands. The channel 20 is further configured such that the command port 202 receives the read command corresponding to the activation command after the command port 202 receives the activation command for a storage bank. More specifically, the activation command includes the row address signal, and the row address signal is received through the row address port 212; and the read command includes the column address signal, and the column address signal is received through the column address port 222. It is to be noted that the activation command and the read command may further contain other control signals except the row address signal or the column address signal. These other control signals are configured to help or assist the storage chips to recognize whether the command is the activation command or the read command, and these other control signals may be received through other command ports except the row address port 212 and the column address port 222. In this way, the row address port 212 may continuously receive the row address signal, and the column address port 222 may continuously receive the column address signal. Accordingly, the channel 20 is further configured such that the activation command and the read command are received through different ports in the command port 202, and thus the activation command and the read command may be received simultaneously. Furthermore, the channel 20 is further configured such that the data port 203 sends the data signal after the command port 202 receives the read command.

In the embodiment, the command signal includes the activation command and the read command corresponding to the activation command. The channel is further configured such that after the command port 202 alternately receives the activation commands for the different storage banks 201, the command port 202 alternately receives the read commands corresponding to the activation commands. Specifically, after the row address port 212 alternately receives the activation commands for the different storage banks 201, the column address port 222 alternately receives the read commands corresponding to the activation commands.

Furthermore, the channel is further configured such that the data port 203 alternately sends the data signals corresponding to the different storage banks 201 after the command port 202 receives the read command.

Detailed illustration related to difference between the first storage chip set 210 and the second storage chip set 220 may refer to the above-mentioned embodiments. An operation mode of the command port 202 is illustrated below in detail by taking the storage chips in the first storage chip set 210 as an example.

The first storage chip set 210 includes a first storage chip 211 and a second storage chip 212; and the second storage chip set 220 includes a third storage chip 221 and a fourth storage chip 222.

The command port 202 of the first storage chip 211 adopts the rising edge of the first clock signal to receive or send a signal, the data port 203 adopts the rising edge of the first clock signal to receive or send the signal, and the storage chip is denoted as the storage chip C1. The command port 202 of the second storage chip 212 adopts the falling edge of the first clock signal to receive or send a signal, the data port 203 adopts the falling edge of the first clock signal to receive or send the signal, and the storage chip is denoted as the storage chip C2. The command port 202 of the third storage chip 221 adopts the rising edge of the second clock signal to receive or send a signal, the data port 203 adopts the rising edge of the second clock signal to receive or send the signal, and the storage chip is denoted as the storage chip C3. The command port 202 of the fourth storage chip 222 adopts the falling edge of the second clock signal to receive or send a signal, the data port 203 adopts the falling edge of the second clock signal to receive or send the signal, and the storage chip is denoted as the storage chip C4.

Figure 6:
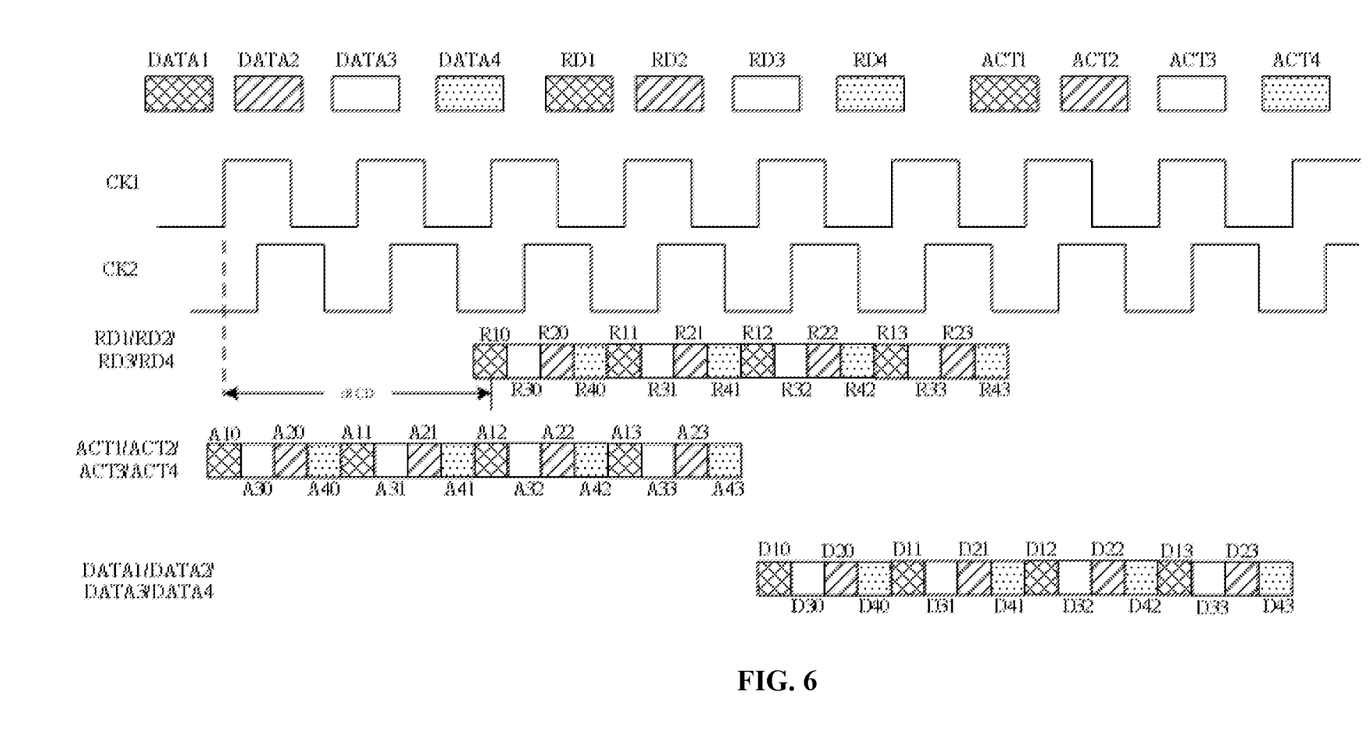
FIG. 6 is a timing diagram of operations of all storage chips in a memory provided by another embodiment of the present disclosure.

FIG. 6 is a timing diagram of the operations of the storage chips C1/C2/C3/C4. The operating principle of the memory will be illustrated below with reference to the timing diagram.

In FIG. 6, CK1 shows the first clock signal, CK2 shows the second clock signal, ACT1/ACT2/ACT3/ACT4 correspondingly show the timing diagram of the activation command signals for the storage chips C1/C2/C3/C4, RD1/RD2/

RD3/RD4 show the timing diagram of the read command signals for the storage chips C1/C2/C3/C4, and DATA1/DATA2/DATA3/DATA4 show the timing diagram of the data signals of the data ports of the storage chips C1/C2/C3/C4.

Taking an example that the storage chip C1 includes the four storage banks 201 of bank10, bank11, bank12 and bank13, the activation command signal ACT1 includes A10/A11/A12/A13 configured to activate bank10, bank11, bank12 and bank13 respectively, A10 corresponds to bank10, A11 corresponds to bank11, and so on. The read command signal RD1 includes R10/R11/R12/R13 corresponding to bank10, bank11, bank12 and bank13 one to one, and the data signal DATA1 includes D10/D11/D12/D13. The activation command A10 corresponds to bank10, one read command R10 and the data signal D10; the activation command A11 corresponds to bank11, one read command R11 and the data signal D11; the activation command A12 corresponds to bank12, one read command R12 and the data signal D12; and the activation command A13 corresponds to bank13, one read command R13 and the data signal D13. That is, one activation command corresponds to one read command.

The detailed illustration related to the activation command signals A20/A21/A22/A23, the read command signals R20/R21/R22/R23 and the data signals D20/D21/D22/D23 corresponding to the storage chip C2, the activation command signals A30/A31/A32/A33, the read command signals R30/R31/R32/R33 and the data signals D30/D31/D32/D33 corresponding to the storage chip C3, and the activation command signals A40/A41/A42/A43, the read command signals R40/R41/R42/R43 and the data signals D40/D41/D42/D43 corresponding to the storage chip C4 may refer to the above-mentioned illustration.

As illustrated in FIG. 6, as for the storage chip C1, taking an example that the command port 202 and the data port 203 adopt the rising edge of the first clock signal to receive or send a signal: after the command port 202 receives the activation command A10 for one storage bank at the rising edge of the first clock signal, the command port 202 receives one read command R10 corresponding to the activation command A10 at the rising edge; and after the command port 202 receives the read command R10, the data port 203 sends the data signal D10 at the rising edge of the first clock signal. The flow after the command port 202 receives the activation commands A11/A12/A13 is similar to that of the above mentioned.

Specifically, the row address port 212 in the command port 202 receives the activation command A10 for activating bank10 at the first rising edge of the first clock signal, and the row address port 212 in the command port 202 receives the activation command A11 for activating bank11 at the second rising edge of the first clock signal, receives the activation command A12 for activating bank12 at the third rising edge of the first clock signal, and receives the activation command A12 for activating bank13 at the fourth rising edge of the first clock signal. The column address port 222 in the command port 202 receives the read command R10 corresponding to the activation command A10 at the $n^{th}$ rising edge, and the command port 202 receives the read command R11 corresponding to the activation command A11 at the $(n+1)^{th}$ rising edge, receives the read command R12 corresponding to the activation command A12 at the $(n+2)^{th}$ rising edge, and receives the read command R13 corresponding to the activation command A13 at the $(n+3)^{th}$ rising edge, in which n is any natural number. Accordingly, the data port 203 sends the data signal D10 corresponding to the storage bank bank10 at the $m^{th}$ rising edge of the first clock signal, and the data port 203 sends the data signal D11 corresponding to the storage bank bank11 at the $(m+1)^{th}$ rising edge of the first clock signal, sends the data signal D12 corresponding to bank12 at the $(m+2)^{th}$ rising edge, and sends the data signal D13 corresponding to bank13 at the $(m+3)^{th}$ rising edge, in which m is any natural number. As for each storage bank, the corresponding m is larger than n.

It is to be noted that FIG. 6 takes an example that the activation commands A10, A11, A12 and A13 are received respectively at the continuous rising edge, that is, the activation commands corresponding to the different storage banks are received respectively at the continuous rising edge. In other embodiments, the activation commands corresponding to the different storage banks may also be received respectively at non-continuous rising edges.

It can be seen from FIG. 6 that the row address port 212 and the column address port 222 are not shared, and therefore, during the period that the column address port 222 receives the read command R10, the row address port 212 may receive the activation command A12. In this way, the activation commands can be received without the need of waiting all the read command signals to be completely received, thus a data bus may be filled, that is, the data port 203 may transmit the data continuously, thereby avoiding the idle problem of the data bus in a certain period of time, and increasing the storage speed of the memory advantageously.

Furthermore, as illustrated in FIG. 6, as for the storage chip C2, the command port 202 and the data port 203 adopt the falling edge of the first clock signal to receive or send a signal: after the command port 202 receives the activation command A10 for one storage bank 201 at the falling edge of the first clock signal, the command port 202 receives one read command R20 corresponding to the activation command A20 at the rising edge; and after the command port 202 receives the read command R20, the data port 203 sends the data signal D20 at the falling edge of the first clock signal. A process related to the storage chip C2 sending the data signals D21/D22/D23 will not be repeated in detail.

Operating processes related to the storage chip C3 and the storage chip C4 are similar to the operation mode of the above-mentioned storage chips C1/C2, and may refer to the above-mentioned illustration, which will be not repeated. It can be understood that phase of the first clock signal is different from phase of the second clock signal, and the storage chips C1/C2/C3/C4 receive or send the signals at the different clock edges of the first clock signal and the different clock edges of the second clock signal, so that the four storage chips sharing the communication channel 02 transmit the data without interfering each other.

In another example, the command signal includes activation commands and a plurality of read commands corresponding to each activation command. The channel 20 is further configured such that after the command port 202 receives the activation command for a storage bank 201, the command port 202 receives one read command corresponding to the activation command at the plurality of corresponding clock edges, that is, the command port 202 receives the plurality of read commands corresponding to the activation commands at the plurality of consecutive corresponding clock edges. The channel 20 is further configured such that the data port 203 sends the plurality of data signals at the plurality of consecutive corresponding clock edges, and the number of the data signals is the same as the number of the received read commands. Specifically, the activation command includes the row address signal, and the read command includes the column address signal. The channel 20 is further configured such that the activation command and the read command are received through the different ports in the command port.

Furthermore, the command signal may include the activation commands and a plurality of read commands corresponding to each activation command. The channel 20 may further be configured such that the command port 202 alternately receives the plurality of read commands corresponding to each activation command after the command port 202 alternately receives the activation commands for the different storage banks 201. Specifically, after the command port 202 alternately receives the activation commands for the different storage banks 201, the command port 202 receives one read command corresponding to the activation command at each clock edge in the plurality of corresponding clock edges, so that the command port 202 receives the plurality of read commands corresponding to the activation commands at the plurality of continuous clock edges, until the command port 202 receives the plurality of read commands corresponding to the activation command, and then the command port 202 receives the plurality of read commands corresponding to the activation command for another storage bank 201.

Figure 7:
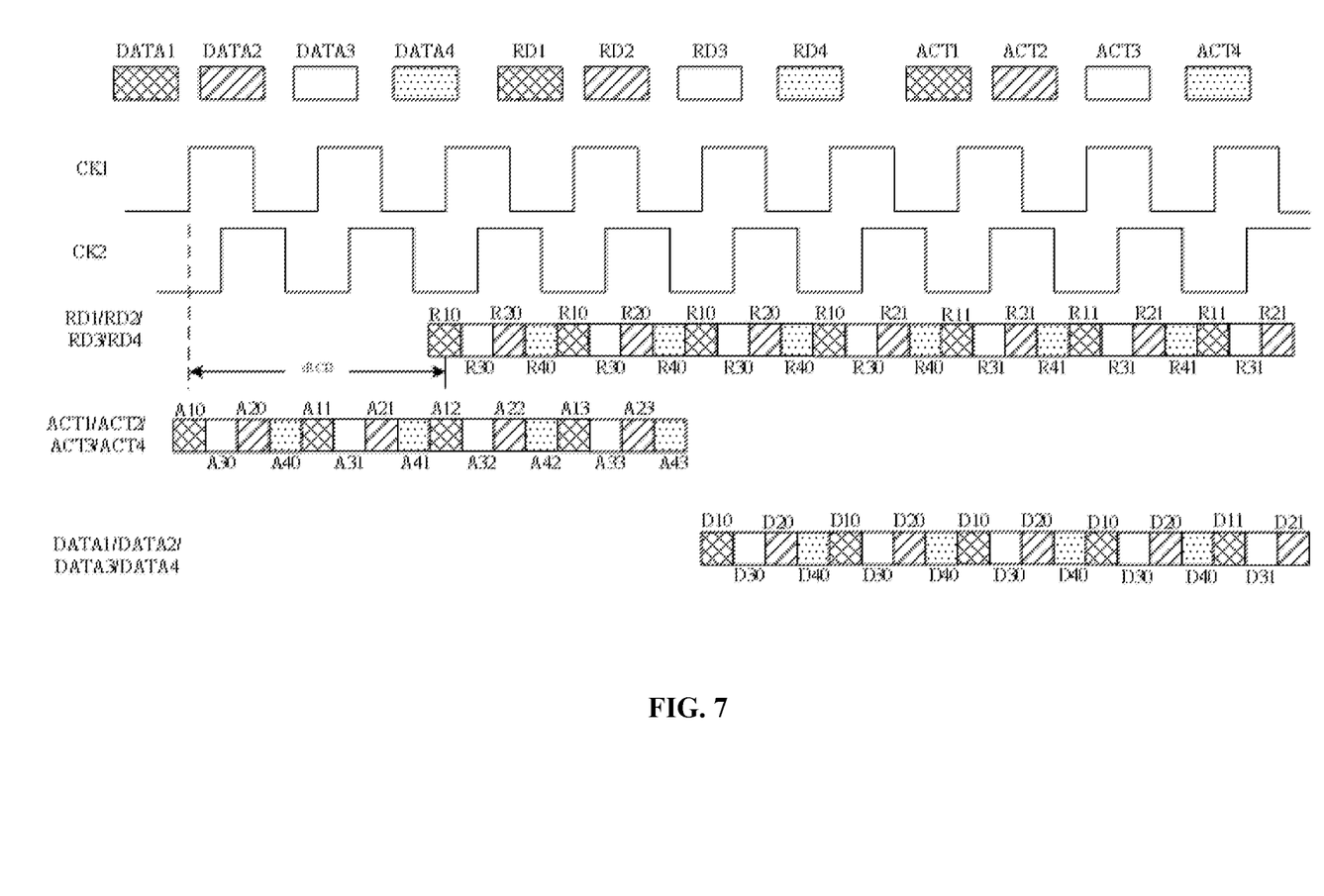
FIG. 7 is another timing diagram of operations of all storage chips in a memory provided by another embodiment of the present disclosure.

FIG. 7 is another timing diagram of operations of the first storage chip set 210 and the second storage chip set 220. The operating principle of the memory will be illustrated below with reference to FIG. 7, taking an example that one activation command corresponds to four read commands.

Illustration related to all the signals in FIG. 7 may refer to corresponding illustration in FIG. 6, and main difference corresponding to FIG. 6 includes: the activation command A10 configured to activate bank10 corresponds to the four read commands R10 and the four data signals D10, the activation command A11 configured to activate bank11 corresponds to the four read commands R11 and the data signals D11, and so on. That is, one activation command corresponds to the plurality of different read commands.

Taking the storage chip C1 receiving or sending the signal at the rising edge of the first clock signal as an example: as illustrated in FIG. 7, after the command port 202 receives the activation command A10 for one storage bank at the rising edge of the first clock signal, the command port 202 receives the four read commands R10 corresponding to the activation command A10 at the four continuous rising edges, and after the command port 202 receives the read commands R10, the data port 203 sends the four data signals D10 at the rising edge of the first clock signal. After receiving the activation command A11 for another storage bank, the command port 202 receives the four read commands R11 corresponding to the activation command A11 at the four continuous rising edges, and after the command port 202 receives the read commands R11, the data port 203 sends the four data signals D11 at the rising edge of the first clock signal. The flow after the command port 202 receives the activation commands A12 and A13 is similar to that of the above mentioned.

The storage chip C2 sends or receives the signal at the falling edge of the first clock signal, that is, the storage chip C2 performs information interaction with the control chip 214 at the falling edge of the first clock signal. The storage chip C3 performs information interaction with the control chip 214 at the rising edge of the second clock signal, and the storage chip C4 performs information interaction with the control chip 214 at the falling edge of the second clock signal. The operating principle of the storage chips C2/C3/C4 may refer to the operating principle of the storage chip C1.

It is to be noted that in the embodiment, the channel is further configured: as for any storage bank, a time reference between receiving the command signal and receiving the corresponding read command signal is larger than or equal to tRCD, and tRCD is the shortest preparation time for performing the read operation by the storage bank after receiving the command signal. Specifically, the definition about tRCD is: an interval from line validness to sending of the read/write command is defined as tRCD, namely, delay from RAS to CAS, RAS is a row address strobing pulse signal, or the row address signal for short, CAS is a column address strobing pulse signal, or the column address signal for short, and tRCD may be understood as a row strobing period. In this way, it may be ensured that the storage banks have been completely activated before receiving the read command or at the time of receiving the read command, and the read operation may be performed at the time of receiving the read command, thereby further increasing the storage speed of the memory.

Specifically, taking the storage chip C1 as an example, as illustrated in FIG. 6 and FIG. 7, as for bank10, the time difference between A10 and R10 is tRCD; and as for bank11, the time difference between A11 and R11 may be larger than or equal to tRCD. The situations with respect to bank12 and bank13 are not listed one by one here. Whether one activation command corresponds to one read command or the plurality of read commands, it may be ensured through reasonable setting that the time reference between receiving the command signal and receiving the corresponding read command signal is larger than or equal to tRCD as for any storage bank.

In the memory provided by the embodiment, the different storage banks adopt the same command port and the same data port. In other embodiments, the different storage banks may also adopt different command ports and different data ports.

The memory provided by the embodiment may realize simultaneous transmission of the row address signal and the column address signal due to the fact that the row address port and the column address port are separated, a data receiving or sending error caused by an error generated by handshake or synchronization of the command clock and the data clock is avoided, thus the problem that the data cable is not occupied completely at the certain time periods is avoided advantageously, and it is ensured that the data cable is occupied completely by the data all the time, thereby increasing the storage speed of the memory, and improving the storage performance of the memory.

Those ordinarily skilled in the art can understand that all the above implementations are the specific embodiments for realizing the present disclosure. However, in actual application, various modifications may be made to the implementations in form and in detail without departing from the spirit and scope of the present disclosure. Any skilled in the art can make respective changes and modifications without departing from the spirit and scope of the present disclosure, and therefore, the protection scope of the present disclosure should be limited by the claims.

What is claimed is:

1. A memory, comprising:
 a control chip; and
 a plurality of storage chips, wherein the plurality of storage chips are electrically connected with the control chip via a common communication channel, the plurality of storage chips comprise a first storage chip set and a second storage chip set, the storage chips in the first storage chip set are configured to perform information interaction with the control chip by adopting a first clock signal, the storage chips in the second storage chip set are configured to perform information interaction with the control chip by adopting a second clock signal, and phase of the first clock signal is different from phase of the second clock signal;

wherein each storage chip comprises at least one channel; the channel comprises: a plurality of storage banks, wherein each storage bank comprises a plurality of storage units, the plurality of storage banks are configured to perform read operation alternately and the plurality of storage banks are configured to perform write operation alternately, a command port, wherein the command port is configured to receive a command signal at a corresponding clock edge, and the command signal is configured to control the read-write operation of the storage banks; and a data port, wherein the data port is configured to receive a data signal to be written into the storage banks or send a data signal at the corresponding clock edge; the corresponding clock edge comprises a clock edge of the first clock signal or a clock edge of the second clock signal; and the command port comprises a row address port and a column address port, the row address port is configured to receive a row address signal of a position where a target storage unit is located, the column address port is configured to receive a column address signal of the position where the target storage unit is located, and the target storage unit is a storage unit selected from the plurality of storage units.

2. The memory of claim 1, wherein the first storage chip set comprises a first storage chip and a second storage chip, the first storage chip performs information interaction with the control chip at a rising edge of the first clock signal, and the second storage chip performs information interaction with the control chip at a falling edge of the first clock signal; and the second storage chip set comprises a third storage chip and a fourth storage chip, the third storage chip performs information interaction with the control chip at a rising edge of the second clock signal, and the fourth storage chip performs information interaction with the control chip at a falling edge of the second clock signal.

3. The memory of claim 2, wherein frequency of the first clock signal is the same as frequency of the second clock signal.

4. The memory of claim 3, wherein a difference between the phase of the first clock signal and the phase of the second clock signal is odd times of 90 degrees.

5. The memory of claim 1, wherein the command signal comprises activation commands and read commands corresponding to respective activation commands; and the channel is further configured such that the command port receives the read command corresponding to the activation command after the command port receives the activation command for a storage bank.

6. The memory of claim 5, wherein the channel is further configured such that the data port sends the data signal after the command port receives the read command.

7. The memory of claim 5, wherein the activation command comprises the row address signal, and the read command comprises the column address signal; and the channel is further configured such that the activation command and the read command are received through different ports in the command port.

8. The memory of claim 1, wherein the command signal comprises activation commands and a plurality of read commands corresponding to each activation command; and the channel is further configured such that after the command port receives the activation command for a storage bank, the command port receives one read command corresponding to the activation command at each of the plurality of corresponding clock edges, to receive the plurality of read commands corresponding to the activation command at a plurality of consecutive corresponding clock edges.

9. The memory of claim 8, wherein the channel is further configured such that the data port sends a plurality of data signals at the plurality of consecutive corresponding clock edges respectively, and a number of the data signals is the same as a number of the received read commands.

10. The memory of claim 8, wherein the activation command comprises the row address signal, and the read command comprises the column address signal; and the channel is further configured such that the activation command and the read command are received through different ports in the command port.

11. The memory of claim 1, wherein the command signal comprises an activation command and a read command corresponding to the activation command; and the channel is further configured such that after the command port alternately receives activation commands for different storage banks, the command port alternately receives read commands corresponding to the activation commands for the different storage banks.

12. The memory of claim 11, wherein the channel is further configured such that the data port alternately sends the data signals corresponding to the different storage banks after the command port receives the read command.

13. The memory of claim 11, wherein the activation command comprises the row address signal, and the read command comprises the column address signal; and the channel is further configured such that the activation command and the read command are received through different ports in the command port.

14. The memory of claim 1, wherein the command signal comprises activation commands and a plurality of read commands corresponding to each activation command; and the channel is further configured such that the command port alternately receives the activation commands for the different storage banks, and the command port alternately receives the plurality of read commands corresponding to each activation command.

15. The memory of claim 14, wherein the activation command comprises the row address signal, and the read command comprises the column address signal; and the channel is further configured such that the activation command and the read command are received through different ports in the command port.

16. The memory of claim 1, wherein the storage chips comprise a plurality of channels, and the storage chips further comprise a common circuit shared by the plurality of channels.

17. The memory of claim 16, wherein the storage chips further comprise: a test port, and in a test mode, the plurality of channels share a same test port for testing.

18. The memory of claim 16, wherein the common circuit comprises a test control circuit, and the test control circuit is configured to control testing of the plurality of channels.

19. The memory of claim 1, wherein the plurality of storage chips are sequentially stacked on the control chip, and the communication channel comprises a through silicon via.

* * * * *